US009076452B2

(12) United States Patent
Yoo

(10) Patent No.: US 9,076,452 B2
(45) Date of Patent: Jul. 7, 2015

(54) APPARATUS AND METHOD FOR GENERATING AUDIO SIGNAL HAVING SOUND ENHANCEMENT EFFECT

(75) Inventor: Chul Jae Yoo, Seongnam-si (KR)

(73) Assignee: RADSONE INC., Seongnam-si, Gyeonggi-do (KR)

( * ) Notice: Subject to any disclaimer, the term of this patent is extended or adjusted under 35 U.S.C. 154(b) by 417 days.

(21) Appl. No.: 13/155,970

(22) Filed: Jun. 8, 2011

(65) Prior Publication Data

US 2012/0140938 A1 Jun. 7, 2012

(30) Foreign Application Priority Data

Dec. 7, 2010 (KR) ........................ 10-2010-0124513

(51) Int. Cl.
*H03G 3/00* (2006.01)
*G10L 21/02* (2013.01)
*G10L 21/0264* (2013.01)

(52) U.S. Cl.
CPC ............. *G10L 21/02* (2013.01); *G10L 21/0264* (2013.01)

(58) Field of Classification Search
CPC ................ H04S 7/305; H04S 2420/01; G10H 2210/281; G10L 2021/02082; G10L 21/0208; H04R 3/02
USPC .................................... 381/63, 61; 84/630, 26
See application file for complete search history.

(56) References Cited

U.S. PATENT DOCUMENTS

| | | | | |
|---|---|---|---|---|
| 4,984,276 A * | 1/1991 | Smith | 381/63 |
| 2006/0018486 A1 * | 1/2006 | Neoran et al. | 381/63 |
| 2008/0273708 A1 * | 11/2008 | Sandgren et al. | 381/63 |
| 2010/0119075 A1 * | 5/2010 | Xiang et al. | 381/63 |

FOREIGN PATENT DOCUMENTS

| | | |
|---|---|---|
| JP | 09-244640 | 9/1997 |
| KR | 10-2006-0012489 | 2/2006 |

* cited by examiner

*Primary Examiner* — Vivian Chin
*Assistant Examiner* — Ammar Hamid
(74) *Attorney, Agent, or Firm* — Sherr & Jiang, PLLC

(57) ABSTRACT

An audio apparatus includes a decay pattern generator configured to generate a decay pattern to be applied in an early reflection region, and generate an audio signal to which a decay pattern is applied by convoluting the generated decay pattern with PCM raw data of a sound source, a reverberation generator configured to generate reverberation from the audio signal to which the decay pattern is applied, and an adder configured to generate an output signal having a sound enhancement effect by adding the PCM raw data to an output of the reverberation generator.

12 Claims, 6 Drawing Sheets

APPARATUS AND METHOD FOR GENERATING AUDIO SIGNAL HAVING SOUND ENHANCEMENT EFFECT

CROSS-REFERENCE TO RELATED APPLICATION

This application claims priority to and the benefit of Korean Patent Application No. 2010-0124513, filed on Dec. 7, 2010, the disclosure of which is incorporated herein by reference in its entirety.

BACKGROUND

1. Field of the Invention

The present invention relates to an audio apparatus and a method of generating an audio signal.

2. Discussion of Related Art

Since 1990s, digital sound sources such as MP3 have come into wide use, and thus people can more easily experience music. Recently, due to the spread of smart phones and portable players, more people can listen to MP3 music. An MP3 method enables music to be listened to with lower data rate by effectively compressing music. However, more compression causes more quantizing errors. The quantizing errors are the cause of generating harsh noises to the ear during play. Thus, if people listen to MP3 music with earphones or headphones or listen to MP3 music in a car or living room for a long time, it can increase listening fatigue. Furthermore, the MP3 music may not exactly deliver the sense of space or natural sound of an original recording environment.

SUMMARY OF THE INVENTION

The present invention is directed to an apparatus and method for generating an audio signal having a sound enhancement effect, for example, less noise, and an enhanced feeling of space and harmonics.

According to an aspect of the present invention, there is provided an audio apparatus including: a decay pattern generator configured to generate a decay pattern to be applied in an early reflection region, and generate an audio signal to which a decay pattern is applied by convolving the generated decay pattern with PCM raw data of a sound source; a reverberation generator configured to generate reverberation from the audio signal to which the decay pattern is applied; and an adder configured to generate an output signal having a sound enhancement effect by adding the PCM raw data to an output of the reverberation generator.

According to another aspect of the present invention, there is provided a method of generating an audio signal including: generating a decay pattern to be applied in an early reflection region; generating an audio signal to which the decay pattern is applied by convolving the generated decay pattern with PCM raw data of a sound source; generating reverberation from the audio signal to which the decay pattern is applied; and generating an output signal having a sound enhancement effect by adding the PCM raw data to an output of the reverberation generator.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the disclosure.

Meanwhile, the meanings of the terms described herein should be understood as follows.

The terminology used herein is for the purpose of describing particular embodiments only and is not intended to be limiting of example embodiments. As used herein, the singular forms are intended to include the plural forms as well, unless the context clearly indicates otherwise. It will be further understood that the terms “comprises,” “comprising,” “includes” and/or “including,” when used herein, specify the presence of stated features, integers, steps, operations, elements and/or components, but do not preclude the presence or addition of one or more other features, integers, steps, operations, elements, components and/or groups thereof.

Each step may be performed in different order from that described herein unless specific order is clearly described in the context. That is, each step may be performed in the same order as described herein, performed substantially at the same time, or performed in opposite order.

In addition, unless otherwise defined, all terms used herein including technical or scientific terms have the same meanings as those which are generally understood by one of ordinary skill in the art. It should be clear that terms defined by dictionaries generally used to have meanings corresponding to those from the context in related technology, and if not clearly defined herein, are not to be understood with ideal or excessively formal meanings.

Figure 1:
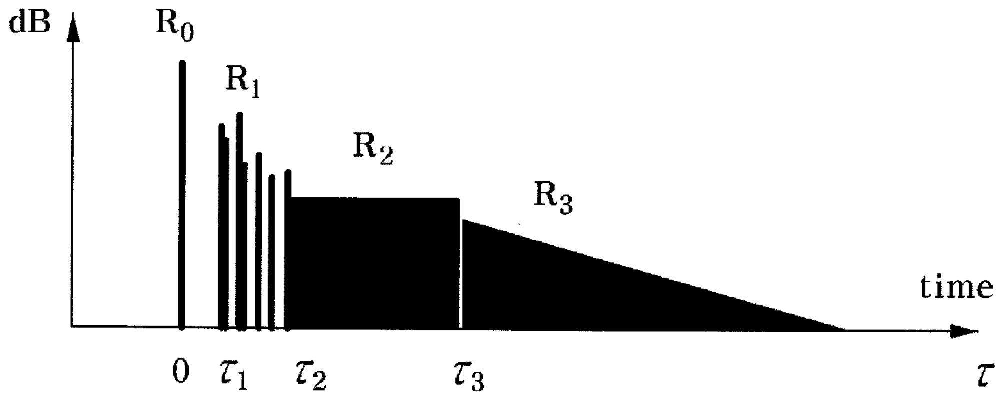
FIG. 1 (Prior Art)
FIG. 1 illustrates an impulse response in time domain according to a sound reverberation effect.

FIG. 1 illustrates an impulse response in time domain according to a sound reverberation effect.

FIG. 1 illustrates an impulse response in time domain obtained from an input signal and an output signal when a sound transmitted from a sound source S is defined as an input signal, and a sound received from a designation R is defined as an output signal. In FIG. 1, a horizontal axis corresponds to time, and a vertical axis corresponds to the amplitude of the impulse response.

Referring to FIG. 1, the impulse response is expressed as the sum of different delay signals having different decay levels in response to the input signal, and corresponds to a composite of signals forming an output signal having a reverberation effect. As shown in FIG. 1, the reverberation effect may be classified into early reflection (ER; R1), cluster (R2) and late reverberation (R3). The ER (R1) may be classified into first ER and remnant ER. Here, the first ER means signals reaching first among early reflected sounds. For example, if a listening space is formed in a rectangular shape, the first ER is a signal received in a designation R after being reflected once from a reflective surface such as side walls, ceiling, and floor. As a reference, the cluster region may or may not be present in reverberation.

Figure 2:
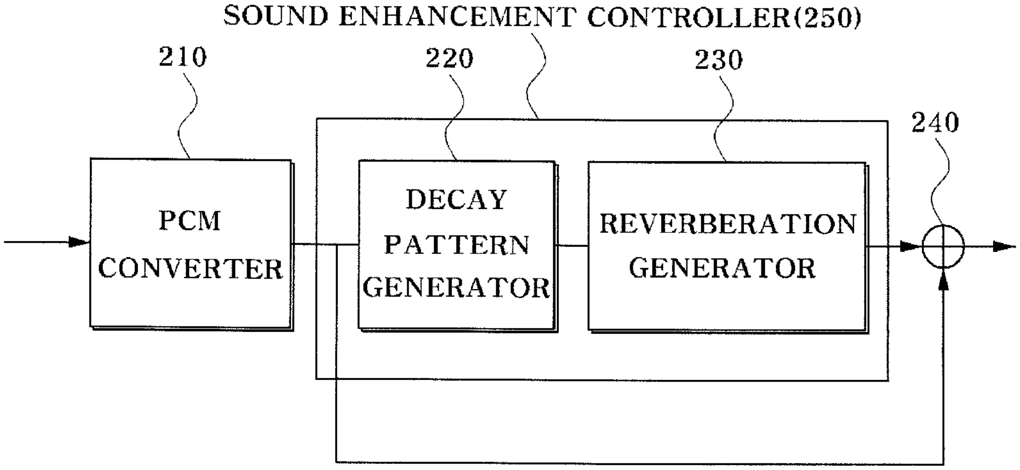
FIG. 2 is a block diagram of an audio apparatus according to an exemplary embodiment of the disclosure.
Figure 3:
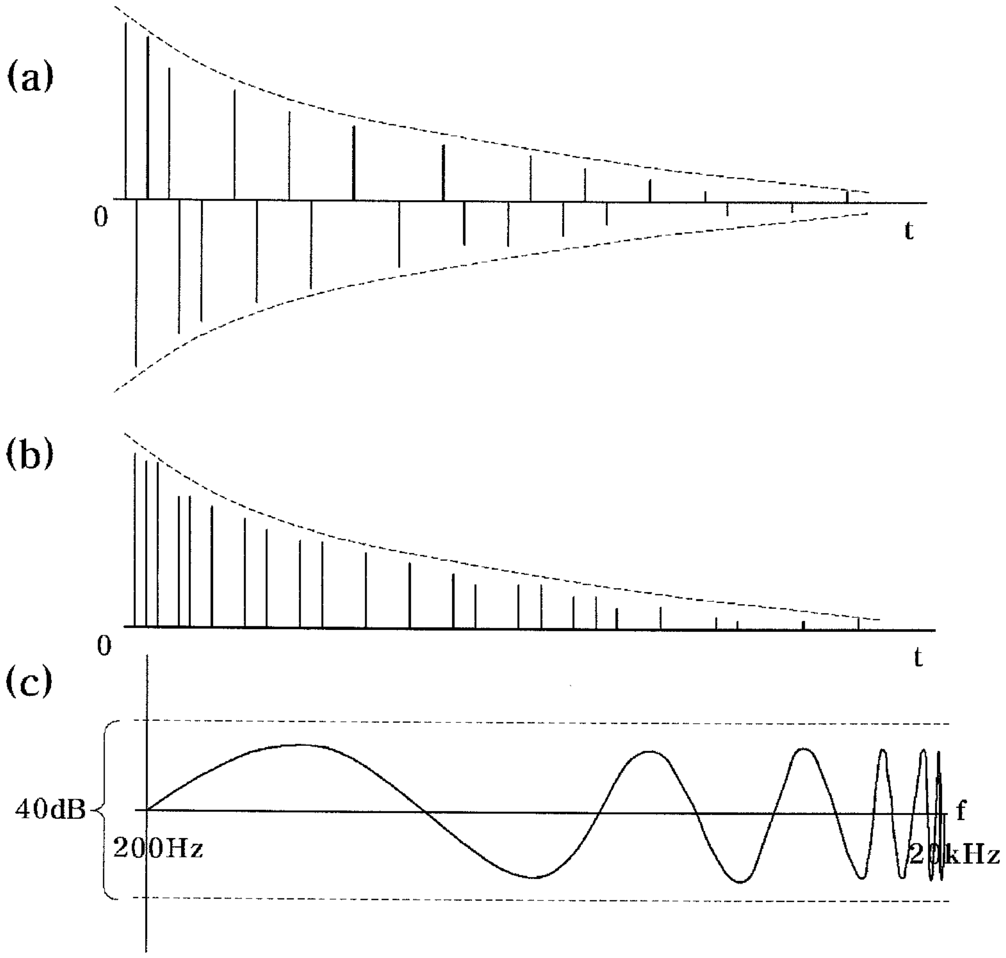
FIG. 3 illustrates an example of a decay pattern present in early reflection (ER) generated by a decay pattern generator of FIG. 2.
Figure 4:
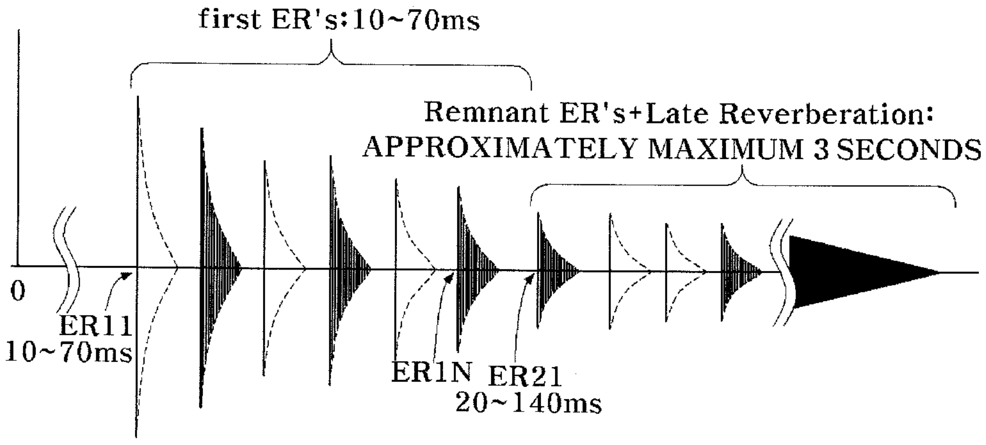
FIG. 4 illustrates an example of an audio signal to which decay patterns generated from the decay pattern generator and a reverberation generator of FIG. 2 are applied.
Figure 5:
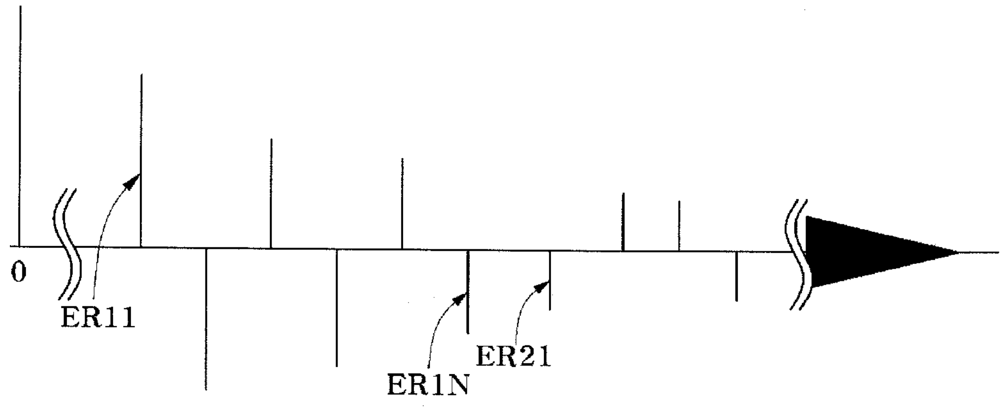
FIG. 5 (Prior Art)
FIG. 5 illustrates an example of an audio signal generated when PCM raw data is convolved with a reverberation generator according to the conventional art.

FIG. 2 is a block diagram of an audio apparatus according to an exemplary embodiment of the disclosure. FIG. 3 illustrates an example of a decay pattern in an ER region generated by a decay pattern generator of FIG. 2, FIG. 4 illustrates an example of an audio signal to which a decay pattern generated from the decay pattern generator and the reverberation generator of FIG. 2 are applied, and FIG. 5 illustrates an example of an audio signal generated when PCM raw data is convolved with a reverberation generator according to the conventional art.

Referring to FIG. 2, an audio apparatus 200 includes a pulse code modulation (PCM) converter 210, a decay pattern generator 220, a reverberation generator 230, and an adder 240. Here, the decay pattern generator 220 and the reverberation generator 230 constitute a sound enhancement controller 250.

The PCM converter 210 generates PCM raw data from an audio source. For example, the PCM converter 210 may generate the PCM raw data by removing header information or flags from an audio source. In another example, the PCM converter 210 may synchronize a sound source such as I2S to generate the PCM raw data. In the above two examples, the sound sources are non-compressed bit streams. However, if the sound source is a compressed bit stream, the PCM raw data may be generated after a decoding operation.

The decay pattern generator 220 generates a decay pattern in an ER region, and convolves the generated decay pattern with the PCM raw data from the PCM converter 210. Here, the decay pattern is applied to ER, and a decay pattern applied to the first ER may be different from that applied to the remnant ER. The length of the decay pattern does not exceed any length between reflected sounds of the first ER portion. That is, the length of the decay pattern is the same as or shorter than the minimal length between the reflected sounds of the first ER portion, which is expressed by the following formula 1:

$$\text{Length of decay pattern} <= \min(ER12-ER11, \ldots, ER1N-ER1N-1) \qquad \text{[Formula 1]}$$

The ER region is determined by the configuration of the reverberation generator 230. Here, the decay pattern may be generated from a finite impulse response (FIR) filter having a similar impulse response to that measured in a place such as an audiovisual (AV) room, a concert hall or an auditorium. For example, the decay pattern generator 220 may generate a decay pattern to have the same amplitude characteristic as that shown in FIG. 3(*a*) or (*b*) and the same frequency characteristic as that shown in FIG. 3(*c*). Referring to FIG. 3, the decay pattern has a form in which an envelope is exponentially decreasing with respect to time domain, and a frequency response between 200 Hz and 20 kHz has several peaks and valleys in a range of 40 dB.

The reverberation generator 230 receives an audio signal to which a decay pattern is applied from the decay pattern generator 220, and generates reverberation with respect to the audio signal. For example, the reverberation generator 230 may be implemented with one of a comb filter, a parallel comb filter, an all pass filter, a finite impulse response filter and a feedback delay network or a composite thereof. For example, when the reverberation generator 230 is implemented with a parallel comb filter, each comb filter may form a feedback structure including a multiplier and a delay. Here, the delay value of each comb filter may be different from each other, and the longest delay value may be 1.5 times or less than the shortest delay value.

Therefore, the PCM raw data which is an output of the PCM converter 210 is sequentially convoluted with the decay pattern generator 220 and the reverberation generator 230, and converted into the audio signal to which the decay pattern is applied, shown in FIG. 4. For example, the first ER may be maintained for approximately 10 to 70 ms, and the remnant ER and late reverberation may be maintained for 3 seconds maximally. ER11 and ERIN of FIG. 4 indicate the first reflected sound and the last reflected sound in the first ER portion, and ER21 indicates the first reflected sound of the remnant ER. As reflected sounds of an audio signal by a conventional reverberation generator correspond to negative numbers (FIG. 5), the patterns by ER12, ER14, ERIN and ER21 are shown by reversed colors to show phase-reversed decay patterns. FIG. 5 illustrates an example of an audio signal generated when PCM raw data is convolved with a reverberation generator according to the conventional art.

The adder 240 adds an output of the PCM converter 210 to an output of the reverberation generator 230 to generate an output signal having a sound enhancement effect.

The audio apparatus according to an exemplary embodiment of the disclosure may be employed in various apparatuses such as an MP3 player, a mobile phone, a car sound system, a TV, a home theater, a multimedia computer, a CD player, a DVD player, and a digital radio. The disclosure may also be applied to compressed sound sources such as MP3, AAC, Dolby Digital, and DTS, and non-compressed sound sources such as CD and DVD. The audio apparatus may use different combinations of the decay pattern generator and the reverberation generator with respect to a left signal and a right signal when the sound source is a stereo signal.

Figure 6:
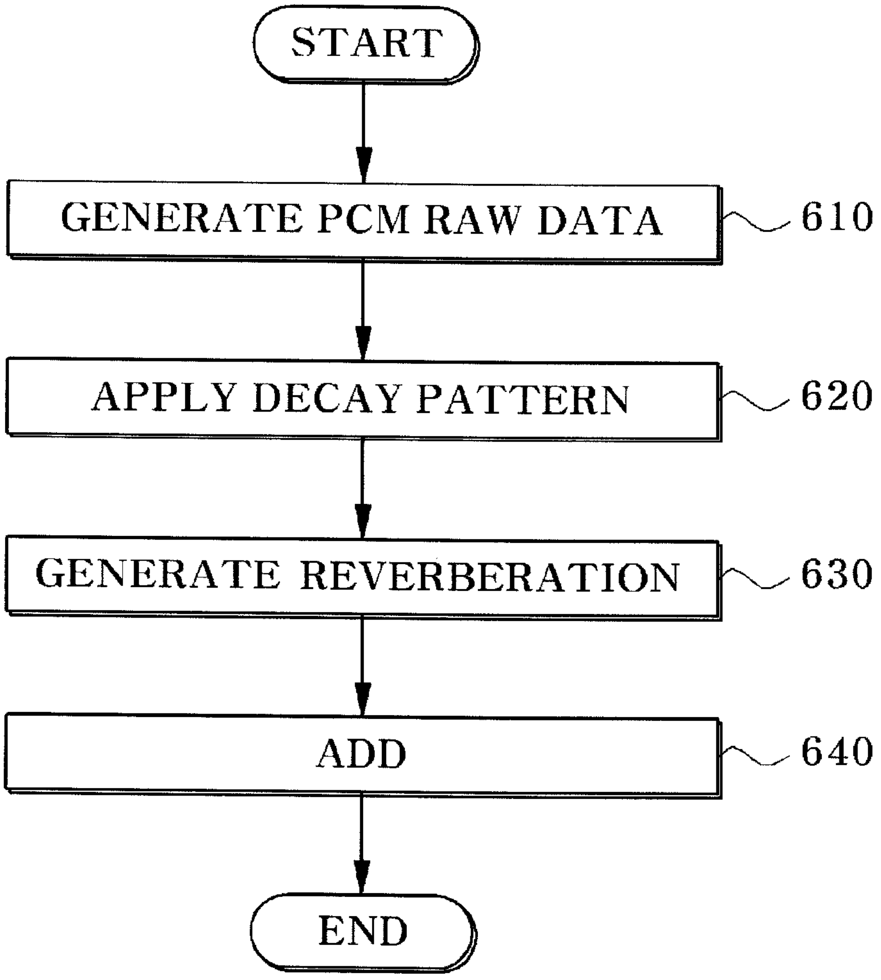
FIG. 6 is a flow chart illustrating a method of generating an audio signal according to an exemplary embodiment of the disclosure.

FIG. 6 is a flow chart illustrating a method of generating an audio signal according to an exemplary embodiment of the disclosure.

Referring to FIG. 6, in operation 610, an audio apparatus generates PCM raw data from an audio source. For example, the audio apparatus may generate the PCM raw data by removing header information or flags from the sound source. In another example, the audio apparatus may be synchronized with a sound source when the sound source is I2S, thereby generating the PCM raw data. In these two examples, the sound sources are non-compressed bit streams, and if the sound source is a compressed bit stream, the PCM raw data may be generated after a decoding operation.

In operation 620, the audio apparatus generates a decay pattern in an ER region, and convolves the generated decay pattern with the PCM raw data to generate an audio signal to which the decay pattern is applied. Here, the decay pattern is applied to the ER, and a decay pattern to be applied to the first ER and a decay pattern to be applied to the remnant ER may be different from each other. The length of the decay pattern does not exceed any length between reflected sounds of the first ER portion. That is, the length of the decay pattern is the same as or shorter than the minimal length between the reflected sounds of the first ER portion, which is expressed by the above-described Formula 1.

In operation 630, the audio apparatus generates reverberation with respect to the audio signal to which a decay pattern is applied. For example, the reverberation generator may be implemented with one of a comb filter, a parallel comb filter, an all pass filter, a finite impulse response filter and a feedback delay network or a composite thereof. The audio apparatus may filter the audio signal to which the decay pattern is applied and generate reverberation.

In operation 640, the audio apparatus adds an audio signal to which the decay pattern generated is applied and which has reverberation in operation 630 with the PCM raw data generated in operation 610, thereby generating an output signal having a sound enhancement effect.

The disclosure has the following effects. However, no specific embodiment need include every effect or only the following effects, and thus the claims of the disclosure should not be understood as being limited thereto.

In an audio apparatus according to an exemplary embodiment, a decay pattern is applied to an audio signal and reverberation is generated with respect to the audio signal to which the decay pattern is applied to be added to the audio signal. Thus, the audio apparatus can output an audio signal having a sound enhancement effect of less noise and an increased feeling of space and harmonics.

It will be apparent to those skilled in the art that various modifications can be made to the above-described exemplary embodiments of the present invention without departing from the spirit or scope of the disclosure. Thus, it is intended that the present invention covers all such modifications provided they come within the scope of the appended claims and their equivalents.

What is claimed is:

1. An audio apparatus, comprising:

a decay pattern generator configured to generate an audio signal to which a decay pattern is applied in an early reflection region by convoluting the decay pattern with PCM raw data of a sound source so that the decay pattern follows each impulse response in the early reflection region of the generated audio signal, wherein the length of the decay pattern does not exceed 35 ms;

a reverberation generator configured to generate reverberation from the audio signal to which the decay pattern is applied in the early reflection region; and an adder configured to generate an output signal having a sound enhancement effect by adding the PCM raw data to an output of the reverberation generator.

2. The apparatus of claim 1, wherein the length of the decay pattern does not exceed any length between reflected sounds present in the first early reflection portion in the early reflection region.

3. The apparatus of claim 1, wherein the decay pattern has a form in which an envelope is exponentially decreasing in time domain, and a frequency response between 200 Hz and 20 kHz has several peaks and valleys within a range of 40 dB.

4. The apparatus of claim 1, wherein the reverberation generator includes at least one of a comb filter, a parallel comb filter, an all pass filter, a finite impulse response (FIR) filter, and a feedback delay network.

5. The apparatus of claim 1, which uses different combinations of the decay pattern generator and the reverberation generator with respect to a left signal and a right signal when the sound source is a stereo signal.

6. A method of generating an audio signal, comprising:

generating a decay pattern to be applied in an early reflection region, wherein the length of the decay pattern does not exceed 35 ms;

generating an audio signal to which the decay pattern is applied by convolving the generated decay pattern with PCM raw data of a sound source so that the generated decay pattern follows each impulse response in the early reflection region of the generated audio signal;

generating reverberation from the audio signal to which the decay pattern is applied in the early reflection region; and generating an output signal having a sound enhancement effect by adding the PCM raw data to an output of the reverberation generator.

7. The method of claim 6, wherein the decay pattern has a length which does not exceed any length between reflected sounds present in the first early reflection portion of the early reflection region.

8. The method of claim 6, wherein the decay pattern has a form in which an envelope is exponentially decreasing in time domain, and a frequency response between 200 Hz and 20 kHz has several peaks and valleys within a range of 40 dB.

9. The method of claim 6, wherein in generating the reverberation from the audio signal to which the decay pattern is applied, the reverberation is generated using at least one of a comb filter, a parallel comb filter, an all pass filter, a finite impulse response (FIR) filter and a feedback delay network.

10. The method of claim 6, which uses different combinations of the decay pattern generator and the reverberation generator with respect to a left signal and a right signal when the sound source is a stereo signal.

11. The apparatus of claim 1, wherein the length of the decay pattern is determined by a configuration of the reverberation generator.

12. The method of claim 6, wherein the length of the decay pattern is determined by a configuration of the reverberation generator.

* * * * *